(12) United States Patent
Moosburger et al.

(10) Patent No.: US 10,483,256 B2
(45) Date of Patent: Nov. 19, 2019

(54) OPTOELECTRONIC SEMICONDUCTOR DEVICE AND APPARATUS WITH AN OPTOELECTRONIC SEMICONDUCTOR DEVICE

(71) Applicant: OSRAM Opto Semiconductors GmbH, Regensburg (DE)

(72) Inventors: Juergen Moosburger, Lappersdorf (DE); Andreas Ploessl, Regensburg (DE)

(73) Assignee: OSRAM OPTO SEMICONDUCTORS GMBH, Regensburg (DE)

(*) Notice: Subject to any disclaimer, the term of this patent is extended or adjusted under 35 U.S.C. 154(b) by 27 days.

(21) Appl. No.: 15/520,666

(22) PCT Filed: Oct. 21, 2015

(86) PCT No.: PCT/EP2015/074353
§ 371 (c)(1),
(2) Date: Apr. 20, 2017

(87) PCT Pub. No.: WO2016/074891
PCT Pub. Date: May 19, 2016

(65) Prior Publication Data
US 2017/0317067 A1    Nov. 2, 2017

(30) Foreign Application Priority Data
Nov. 12, 2014 (DE) .................. 10 2014 116 512

(51) Int. Cl.
*H01L 27/02* (2006.01)
*H01L 33/38* (2010.01)
(Continued)

(52) U.S. Cl.
CPC .......... *H01L 27/0248* (2013.01); *H01L 27/15* (2013.01); *H01L 33/382* (2013.01);
(Continued)

(58) Field of Classification Search
CPC . H01L 27/0248; H01L 33/405; H01L 33/387; H01L 33/62; H01L 27/15;
(Continued)

(56) References Cited

U.S. PATENT DOCUMENTS 7,173,311 B2    2/2007    Sato et al.
7,693,201 B2    4/2010    Albrecht et al.
(Continued)

FOREIGN PATENT DOCUMENTS

DE    102004005269 A1    6/2005
DE    102009006177 A1    6/2010
(Continued)

*Primary Examiner* — Steven H Loke
*Assistant Examiner* — Juanita B Rhodes
(74) *Attorney, Agent, or Firm* — Slater Matsil, LLP

(57) ABSTRACT

An optoelectronic semiconductor device and an apparatus with an optoelectronic semiconductor device are disclosed. In an embodiment the optoelectronic semiconductor component has an emission region including a semiconductor layer sequence having a first semiconductor layer, a second semiconductor layer, and an active region arranged between the first semiconductor layer and the second semiconductor layer for generating radiation, and a protection diode region. The semiconductor component has a contact for electrically contacting the semiconductor component externally. The contact has a first contact region that is connected to the emission region in an electrically conductive manner. The contact has further a second contact region that is spaced apart from the first contact region and connected to the protection diode region in an electrically conductive manner. The first contact region and the second contact region can be
(Continued)

electrically contacted externally by a mutual end of a connecting line.

14 Claims, 4 Drawing Sheets

(51) Int. Cl.
  *H01L 33/62* (2010.01)
  *H01L 27/15* (2006.01)
  *H01L 33/40* (2010.01)
(52) U.S. Cl.
  CPC .......... *H01L 33/387* (2013.01); *H01L 33/405* (2013.01); *H01L 33/62* (2013.01)
(58) Field of Classification Search
  CPC ....... H01L 33/382; H01L 33/58; H01L 33/06; H01L 33/38; H01L 33/08; H01L 33/24; H01L 33/36; H01L 23/498
  See application file for complete search history.

(56) References Cited

U.S. PATENT DOCUMENTS 9,054,016 B2   6/2015   Moosburger et al.
2006/0163604 A1*  7/2006  Shin .................. H01L 27/15 257/103
2008/0290353 A1* 11/2008  Medendorp, Jr. ..... H01L 25/167 257/89
2009/0008666 A1*  1/2009  Otsuka .................. H01L 33/505 257/98
2009/0085048 A1*  4/2009  Lee .................. H01L 27/156 257/89
2011/0284897 A1* 11/2011  Takayama ............ H01L 33/486 257/98
2013/0062638 A1   3/2013  Onushkin et al.
2013/0168718 A1*  7/2013  Shin .................. H01L 33/60 257/98
2013/0285084 A1* 10/2013  Schneider ............... H01L 24/24 257/98
2014/0353692 A1* 12/2014  Oh ........................ H01L 33/385 257/88
2017/0125641 A1*  5/2017  Jeon ..................... H01L 33/382

FOREIGN PATENT DOCUMENTS

DE    102012110909 A1    5/2014
EP        1601019 A2    11/2005
JP       10200159 A     7/1998
JP      2013069802 A  *  4/2013
JP      2013069802 A  *  4/2013

* cited by examiner

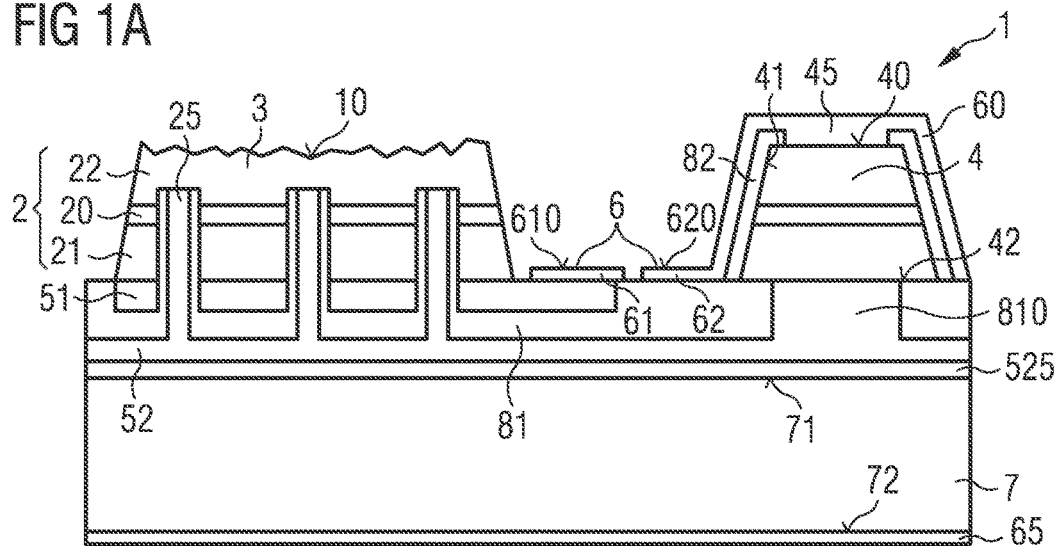
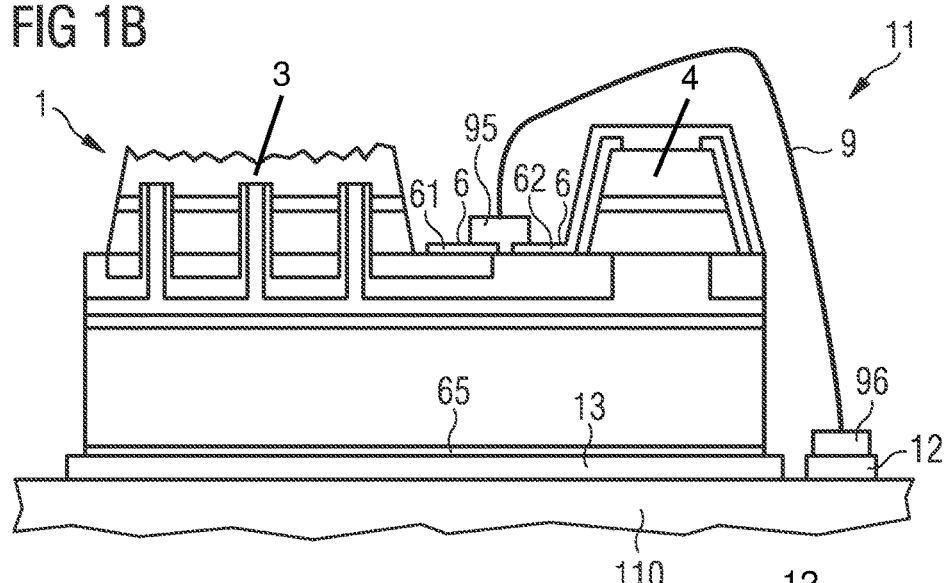
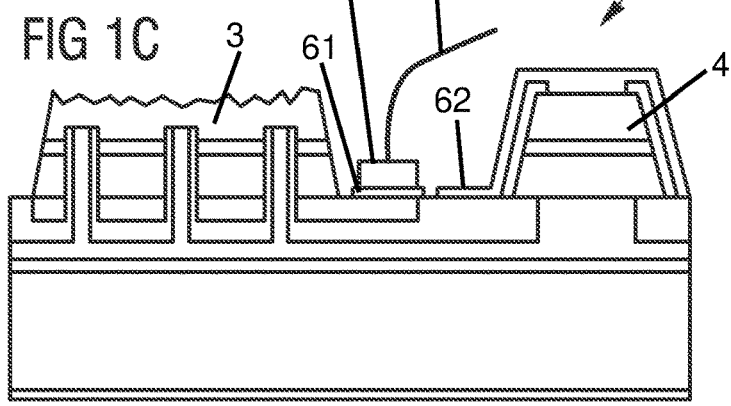

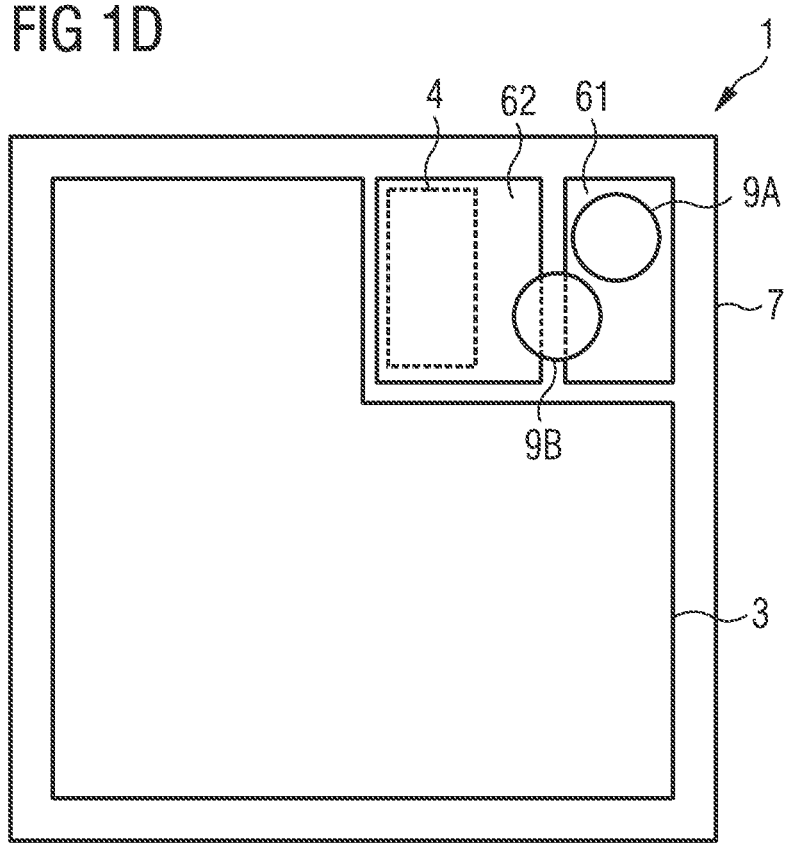

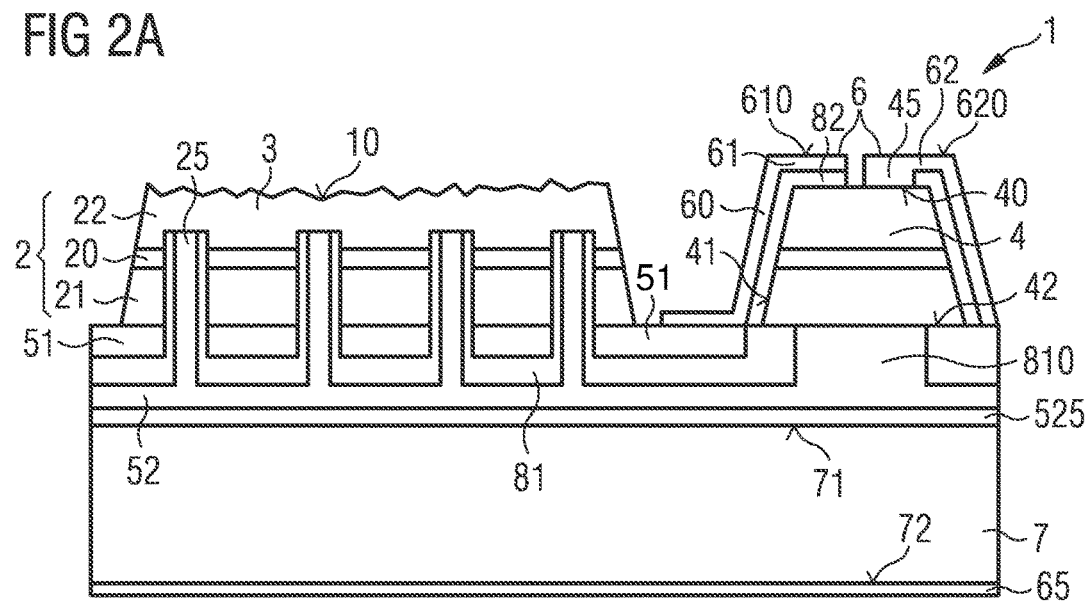
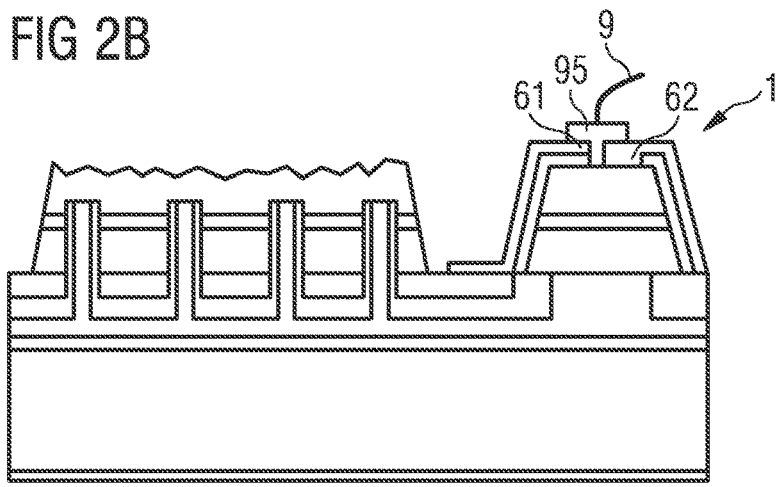
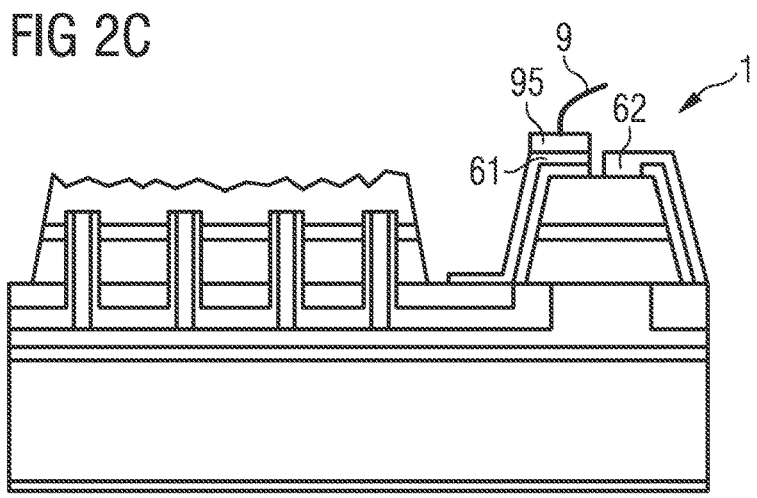

OPTOELECTRONIC SEMICONDUCTOR DEVICE AND APPARATUS WITH AN OPTOELECTRONIC SEMICONDUCTOR DEVICE

This patent application is a national phase filing under section 371 of PCT/EP2015/074353, filed Oct. 21, 2015, which claims the priority of German patent application 10 2014 116 512.8, filed Nov. 12, 2014, each of which is incorporated herein by reference in its entirety.

TECHNICAL FIELD

The present application relates to an optoelectronic semiconductor device and an apparatus with an optoelectronic semiconductor device.

BACKGROUND

In optoelectronic semiconductor devices such as, for example, light-emitting diodes, there is the risk of irreparable damage occurring due to an electrostatic discharge (ESD) during transport or also during processing of the devices. It is estimated that approx. 8 to 33% of electronic component failures are attributable to such ESD damage. ESD protection diodes may be integrated into the devices in order to avoid such damage. Such devices cannot, however, be used in applications in which ESD protection diodes have a disruptive effect or are at least unwanted.

SUMMARY OF THE INVENTION

Embodiments provide an optoelectronic semiconductor device which provides ESD protection functionality and is universally applicable.

According to at least one embodiment of the optoelectronic semiconductor device, the semiconductor device comprises an emission region. The emission region comprises a semiconductor layer sequence with a first semiconductor layer, a second semiconductor layer and, arranged between the first semiconductor layer and the second semiconductor layer, an active region. The active region is provided for generating radiation, for example, in the ultraviolet, visible or infrared region of the spectrum. The active region is, for example, arranged between a first semiconductor layer and a second semiconductor layer. The first semiconductor layer and the second semiconductor layer are conveniently different from one another with regard to conduction type, such that the active region is situated in a pn junction. For example, the first semiconductor layer is n-conductive and the second semiconductor layer p-conductive or vice versa. The first semiconductor layer and/or the second semiconductor layer may be of single layer or indeed multilayer construction.

According to at least one embodiment of the semiconductor device, the semiconductor device comprises a protection diode region. The protection diode region is in particular provided to provide protection from ESD damage. Unlike the emission region, the protection diode region does not serve to generate radiation when the semiconductor device is in operation.

According to at least one embodiment of the semiconductor device, the semiconductor device has a contact for external electrical contacting of the semiconductor device. For example, the first semiconductor layer or the second semiconductor layer of the emission region is electrically conductively connected to the contact. The contact is in particular constructed and arranged such that it is accessible for external electrical contacting by means of a connecting lead, for example, a wire bond connection. In other words, the contact is a bond pad.

According to at least one embodiment of the semiconductor device, the contact comprises a first contact region which is electrically conductively connected to the emission region. When the semiconductor device is in operation, charge carriers may pass via the first contact region into the emission region.

According to at least one embodiment of the semiconductor device, the contact comprises a second contact region which is at a distance from the first contact region and is electrically conductively connected to the protection diode region. In particular, the second contact region is not electrically conductively connected to the emission region.

The first contact region and the second contact region are thus sub-regions of the contact, wherein these sub-regions are not directly electrically conductively connected together. Within the contact, there is thus no current path between the first contact region and the second contact region. In other words, the contact is segmented into two, in particular precisely two, mutually isolated sub-regions.

According to at least one embodiment of the semiconductor device, the first contact region and the second contact region are externally electrically contactable by means of a common connecting lead, for example, a wire bond connection. One end of a connecting lead, for example, the ball or the wedge of a wire bond connection, may thus be positioned such that the latter is electrically conductively connected both to the first contact region and to the second contact region. In other words, the first contact region and the second contact region are electrically conductively connected together via the common end of the connecting lead. The other end of the connecting lead may, for example, be connected to a connection carrier, for instance a printed circuit board or a leadframe. No connecting lead which is fastened with one end to the first contact region and with the other end to the second contact region is thus required for the electrical connection between the emission region and the protection diode region. A single connecting lead is thus sufficient for electrically contacting both the emission region and the protection diode region with a connection carrier.

In at least one embodiment of the semiconductor device, the semiconductor device comprises an emission region, wherein the emission region comprises a semiconductor layer sequence with a first semiconductor layer, a second semiconductor layer and, arranged between the first semiconductor layer and the second semiconductor layer, an active region provided for generating radiation. The semiconductor device comprises a protection diode region. The semiconductor device comprises a contact for external electrical contacting of the semiconductor device. The contact comprises a first contact region which is electrically conductively connected to the emission region. The contact comprises a second contact region which is at a distance from the first contact region, wherein the second contact region is electrically conductively connected to the protection diode region. The first contact region and the second contact region are externally electrically contactable by means of a common end of a connecting lead, in particular of a single connecting lead.

According to at least one embodiment of the semiconductor device, the first contact region is externally electrically contactable by means of the connecting lead independently of the second contact region. The semiconductor device thus provides two contacting options by means of a connecting lead which differ from one another. The connecting lead is, for example, a wire bond connection.

During electrical contacting, it is possible to select whether the protection diode region is or is not electrically contacted in addition to the emission region. In particular, the first contact region is of a size such that it is electrically contactable with a wire bond connection without the second contact region likewise being electrically contacted. In the case of electrical contacting by means of a connecting lead such that there is no contact with the second contact region, the semiconductor device thus behaves like a semiconductor device which does not have an integrated protection diode region. In this manner, the field of use of the semiconductor device is enlarged.

According to at least one embodiment of the semiconductor device, the protection diode region is a semiconductor body which has the same multilayer structure as the emission region. When producing the semiconductor device, the emission region and the protection diode region may originate from a common semiconductor layer sequence. The emission region and the protection diode region are thus sub-regions of the semiconductor layer sequence which are mutually isolated in the lateral direction, i.e., along a main plane of extension of the semiconductor layers of the semiconductor layer sequence. The protection diode region in particular likewise comprises an active region which corresponds in its multilayer structure to the active region, said former active region however not emitting any radiation when the semiconductor device is in operation, in particular for both the above-described types of electrical contacting.

In particular, when the semiconductor device is in operation, either no voltage is applied to the protection diode region or, in operation, a voltage in the reverse direction is applied to the protection diode region, such that no radiation is emitted. When the semiconductor device is in operation, the emission region and the protection diode region are conveniently interconnected in antiparallel with regard to their forward direction.

According to at least one embodiment of the semiconductor device, the first contact region and the second contact region are arranged laterally of the emission region and laterally of the protection diode region. In other words, in plan view onto the semiconductor device, the first contact region and the second contact region are in each case arranged without overlap with the emission region and the protection diode region. The first contact region and the second contact region are thus located in a region from which the semiconductor layer sequence of the semiconductor device has been removed.

According to at least one embodiment of the semiconductor device, in plan view onto the semiconductor device, the first contact region and second contact region overlap with the protection diode region. In particular, in plan view onto the semiconductor device, the first contact region and the second contact region are located completely within the protection diode region. No additional area, which is not usable for generating radiation, is thus required for forming the first contact region and the second contact region.

According to at least one embodiment of the semiconductor device, the semiconductor device comprises a further contact for external electrical contacting, wherein the further contact is electrically conductively connected to the emission region and the protection diode region. In particular, by applying the external electrical voltage between the contact and the further contact, charge carriers can be injected from different sides into the active region where they recombine with emission of radiation. For example, the further contact is electrically conductively connected to the second semiconductor layer of the emission region and to the first semiconductor layer of the protection diode region.

According to at least one embodiment of the semiconductor device, the semiconductor layer sequence is arranged on a carrier. For example, the semiconductor layer sequence is fastened to the carrier layer by means of a bonding layer, for instance a solder layer or an adhesive layer. The carrier in particular differs from a growth substrate for epitaxial deposition of the semiconductor layer sequence. The carrier serves to provide mechanical stabilization for the semiconductor layer sequence. The growth substrate is no longer required for this purpose and may therefore be completely or at least partially removed. A semiconductor device from which the growth substrate has been removed is also known as a thin-film semiconductor device.

According to at least one embodiment of the semiconductor device, the contact is arranged on the side of the semiconductor layer sequence facing the carrier. The contact is thus a front contact, the front surface being considered to be the side of the semiconductor device from which radiation mostly exits when the semiconductor device is in operation.

According to at least one embodiment of the semiconductor device, the contact is arranged on the side of the carrier facing the semiconductor layer sequence and the further contact on the side of the carrier facing away from the semiconductor layer sequence. The semiconductor device thus has a front contact and a back contact. In contrast thereto, it is also conceivable for the further contact also to be located on the front surface of the carrier.

According to at least one embodiment of the semiconductor device, the first semiconductor layer is electrically conductively connected in the emission region to a first connection layer, wherein the first connection layer extends in places between the carrier and the emission region. In particular, viewed in the vertical direction, the first connection thus extends perpendicular to the main plane of extension of the semiconductor layers of the semiconductor layer sequence between the emission region and the carrier. In particular, the first semiconductor layer is electrically conductively connected in the emission region via the first connection layer to the first contact region.

According to at least one embodiment of the semiconductor device, the emission region comprises at least one recess which extends through the first semiconductor layer and the active region into the second semiconductor layer. The second semiconductor layer is electrically conductively connected in the at least one recess to a second connection layer, wherein the second connection layer extends in places between the emission region and the carrier. In particular, the first connection layer extends in places between the emission region and the second connection layer. In plan view onto the semiconductor device, the first connection layer and the second connection layer overlap in places.

According to at least one embodiment of the semiconductor device, a surface of the first contact region facing away from the carrier is located at the same distance or substantially at the same distance from the carrier as a surface of the second contact region facing away from the carrier. "Substantially at the same distance" means that the distances differ from one another by at most 5 μm. The difference preferably amounts to at most 2 μm, particularly preferably at most 1 μm. In other words, the surfaces of the first contact region and of the second contact region facing away from the carrier form a common plane. Simultaneous electrical contacting of the first contact region and the second contact region by means of a connecting lead is consequently simplified.

According to at least one embodiment of the semiconductor device, the first contact region and the second contact region are arranged at a distance from one another between 0.1 µm and 50 µm inclusive, preferably between 2 µm and 5 µm inclusive. With such a distance between the first contact region and the second contact region, depending on the nature of the desired external contacting, it is reliably possible to achieve contacting not only of the first contact region alone but also common contacting of the first contact region and the second contact region.

BRIEF DESCRIPTION OF THE DRAWINGS

Further embodiments and convenient aspects are revealed by the following description of the exemplary embodiments in conjunction with the figures.

In the figures:

FIG. 1A is a schematic sectional view of a semiconductor device;

FIGS. 1B and 1C are exemplary embodiments of apparatuses with different kinds of electrical contacting of the semiconductor device according to FIG. 1A;

FIG. 1D is a schematic plan view of an exemplary embodiment of a semiconductor device;

FIG. 2A is a schematic sectional view of an exemplary embodiment of a semiconductor device;

FIGS. 2B and 2C are exemplary embodiments of apparatuses with different kinds of electrical contacting of the semiconductor device according to FIG. 2A.

Identical, similar or identically acting elements are provided with identical reference numerals in the figures.

Figure 3:
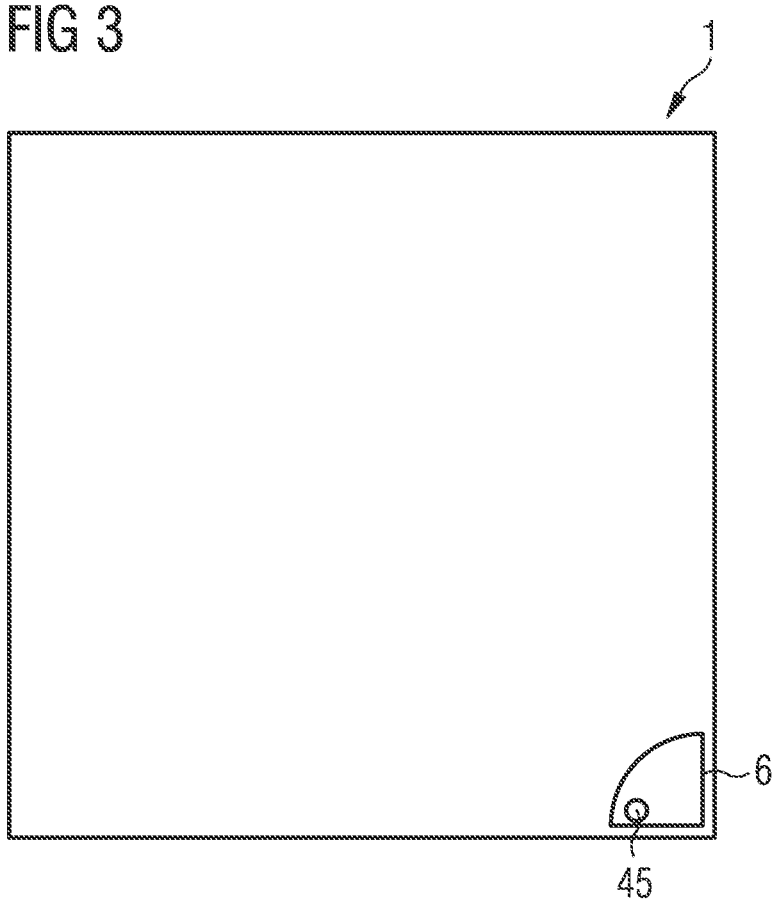
FIG. 3 is a schematic representation of a semiconductor device in plan view.

The figures are in each case schematic representations and are therefore not necessarily true to scale. Rather, comparatively small elements and in particular layer thicknesses may be illustrated on an exaggeratedly large scale for clarification.

DETAILED DESCRIPTION OF ILLUSTRATIVE EMBODIMENTS

FIG. 1A shows a schematic sectional view of an exemplary embodiment of an optoelectronic semiconductor device 1. The semiconductor device 1 comprises an emission region 3. The emission region 3 comprises a semiconductor layer sequence 2 with an active region 20 for generating radiation. The active region 20 is arranged between a first semiconductor layer 21 of a first conduction type and a second semiconductor layer 22 of a second conduction type different from the first conduction type. For example, the first semiconductor layer 21 is p-conductive and the second semiconductor layer 22 n-conductive.

The semiconductor device 1 furthermore comprises a protection diode region 4. In the exemplary embodiment shown, the protection diode region 4 takes the form of a semiconductor body which, during production of the semiconductor device 1, originates from the same semiconductor layer sequence 2 as the emission region 3. The protection diode region 4 thus likewise comprises an active region 20, wherein, however, unlike the active region 4 of the emission region 3, said active region 20 is not provided for generating radiation when the semiconductor device 1 is in operation.

The semiconductor layer sequence 2 with the emission region 3 and the protection diode region 4 is arranged on a carrier 7. For example, the semiconductor layer sequence 2 is fastened to the carrier 7 by means of a bonding layer 525, for instance a solder layer or an in particular electrically conductive adhesive layer. The carrier 7 differs from a growth substrate for the epitaxial deposition of the semiconductor layer sequence 2. The carrier 7, for example, contains a semiconductor material, for instance silicon or germanium or consists of such a material. The carrier 7 extends in the vertical direction, thus perpendicular to a main plane of extension of the semiconductor layers of the semiconductor layer sequence 2, between a front surface 71 facing the semiconductor layer sequence 2 and a back surface 72 facing away from the semiconductor layer sequence 2.

The semiconductor device 1 comprises a contact 6 for external electrical contacting of the semiconductor device 1. The contact 6 is segmented into a first contact region 61 and a second contact region 62. The first contact region 61 is electrically conductively connected to the emission region 3. The second contact region 62 is electrically conductively connected to the protection diode region 4. The first contact region 61 and the second contact region 62 are thus sub-regions of the contact 6 which are at a distance from one another and are not directly electrically conductively connected together.

The semiconductor device 1 comprises a further contact 65 for external electrical contacting of the semiconductor device 1. When the semiconductor device 1 is in operation, by applying an external electrical voltage between the contact 6 and the further contact 65, charge carriers can be injected from opposing sides into the active region 2 where they recombine with emission of radiation. The further contact 65 is arranged on the back surface 72 of the carrier 7. The contact 6 and the further contact 65 are thus arranged on opposing sides of the carrier 7. The semiconductor device 1 is thus, as shown in FIG. 1B, electrically contactable when the semiconductor device 1 is fastened to a connection carrier 110, for example, to a printed circuit board or a leadframe. In contrast thereto, the further contact 65 may also be arranged on the front surface 71 of the carrier 7 and be electrically contacted, for example, by means of a further connecting lead.

The further contact 65 is electrically conductively connected to the emission region 3 and the protection diode region 4. In the exemplary embodiment shown, the further contact 65 is electrically conductively connected to the second semiconductor layer 22 of the emission region 3 and to the first semiconductor layer 21 of the protection diode region 4.

The first contact region 61 is electrically conductively connected to the first semiconductor layer 21 of the emission region 3. The second contact region 62 is electrically conductively connected to the second semiconductor layer 22 of the protection diode region 4.

The first contact region 61 and the second contact region 62 are arranged relative to one another in such a manner that, as shown in FIG. 1B, they are externally electrically contactable by means of a common end 95 of a connecting lead 9, for example, of a wire bond connection. A surface 610 of the first contact region 61 facing away from the carrier 7 and a surface 620 of the second contact region 62 facing away from the carrier 7 are located at the same distance or at least substantially at the same distance from the carrier 7. The first contact region 61 and the second contact region 62 thus form a common area for external electrical contacting of the semiconductor device 1 by means of a connecting lead. A distance between the first contact region 61 and the second contact region 62 preferably amounts to between 0.1 µm and 50 µm inclusive, particularly preferably between 2 µm and 5 µm inclusive.

FIGS. 1B and 1C are schematic representations of exemplary embodiments of apparatuses 11 with a semiconductor device 1 according to FIG. 1A. The semiconductor device 1 is electrically conductively connected by means of a connecting lead 9 to a land 12 of the apparatus. The connecting lead 9 extends between an end adjacent the contact 6 and a further end 96 adjacent the land 12. The further contact 65 is electrically conductively connected to a further land 13. The land 12 and the further land 13 are, for example, areas of a connection carrier 110, for instance of a printed circuit board. In contrast thereto, the connection carrier may, for example, also be a leadframe in which sub-regions of the connection carrier 110 form the first land and the second land.

Thanks to the configuration shown in FIG. 1B of the connecting lead 9, both the emission region 3 and the protection diode region 4 are electrically conductively connected to the connecting lead 9, such that the land 12 is connected both to the emission region 3 and to the protection diode region 4 with just one connecting lead. The emission region 3 and the protection diode region 4 are interconnected in antiparallel with regard to forward direction. During normal operation of the semiconductor device 1, charge carriers are thus injected into the emission region 3 where they recombine with emission of radiation. The protection diode region 4, in contrast, is oriented in the reverse direction. In the event of electrostatic charging which results in a voltage being applied to the emission region 3 in the reverse direction, the charge carriers are on the other hand able to flow away via the protection diode region 4, so avoiding ESD damage. The protection diode region 4 thus offers ESD protection integrated in the semiconductor device 1, wherein the protection diode region 4 is not interconnected with the emission region 3 until the semiconductor device is electrically contacted.

Alternatively, electrical contacting may proceed by means of a connecting lead 9 as shown in FIG. 1C in such a manner that only the first contact region 61 is electrically contacted, but not however the second contact region 62. For simplicity's sake, FIG. 1C, like FIGS. 2B and 2C, reproduces only a portion of the apparatus 11 showing the semiconductor device 1 and part of the connecting lead 9.

The first contact region 61 is of a size such that one end of a connecting lead, for example, the ball of a wire bond connection, may, in plan view onto the semiconductor device 1, be placed completely within the first contact region 61.

In this kind of contacting of the semiconductor device 1, the protection diode region 4 is thus not electrically connected, such that, when in operation, the semiconductor device 1 behaves as a radiation-emitting semiconductor device without an integrated protection diode.

Thus it is only when the semiconductor device 1 is electrically contacted that it is established whether the protection diode region 4 integrated in the semiconductor device 1 is or is not interconnected to the emission region 3. The semiconductor device 1 is therefore suitable both for apparatuses which require integrated ESD protection and for apparatuses in which no such ESD protection is desired. No additional manufacturing steps or changes to the kind of electrical contacting are necessary for electrically contacting the protection diode region 4. It is sufficient to place the connecting lead which is in any event necessary for electrically contacting the emission region 3 in such a way that the end 95 of the connecting lead 9 is in contact with both the first contact region 61 and the second contact region 62.

In the exemplary embodiment shown in FIG. 1A, the first semiconductor layer 21 of the emission region 3 is electrically conductively connected by means of a first connection layer 51 to the first contact region 61. Viewed in the vertical direction, the first connection layer 51 extends in places between the emission region 3 and the carrier 7.

The emission region 3 comprises a plurality of recesses 25 which extend through the first semiconductor layer 21 and the active region 20. The second semiconductor layer 22 is electrically conductively connected in the recesses 25 to a second connection layer 52. The front surface 71 of the carrier 7 is in places covered both by the first connection layer 51 and by the second connection layer 52. In plan view onto the semiconductor device 1, the first connection layer 51 and the second connection layer 52 thus overlap in places. The second semiconductor layer 22 is electrically conductively connected in the emission region 3 via the second connection layer 52, the bonding layer 525 and the carrier 7 to the further contact 65. Merely to simplify the illustration, the bonding layer 525 is drawn as a planar layer. The bonding layer 525 may, however, at least partially fill indentations, for example, on the side of the second connection layer 52 facing away from the carrier 7, for example, in the region of the recesses 25.

The first connection layer 51 is preferably provided as a mirror layer for the radiation generated in the active region 20. The first connection layer 51 contains, for example, silver, rhodium, aluminum, nickel or chromium. These materials are distinguished by elevated reflectivity in the visible and ultraviolet region of the spectrum. Gold, for example, is suitable for the red and infrared region of the spectrum.

The above-stated materials are also suitable for the second connection layer 52. The first connection layer 51 and the second connection layer 52 may in particular also be of multilayer construction. For example, a sublayer of the first connection layer 51 and/or a sublayer of the second connection layer 52 may serve as a coupling layer or as a diffusion barrier.

A first insulation layer 81 is arranged for electrical insulation between the first connection layer 51 and the second connection layer 52. The first insulation layer 81 also covers side faces of the recesses 25 in order to avoid an electrical short circuit between the second connection layer 52 and the first semiconductor layer 21 and the active region 20 in the emission region 3. An oxide, for instance silicon oxide or a nitride, for instance silicon nitride, is for example, suitable for the insulation layer.

The first insulation layer 81 furthermore in places covers a back surface 42, facing the carrier 7, of the protection diode region 4. The second connection layer 52 is electrically conductively connected to the back surface 42 of the protection diode region 42 in an opening 810 of the first insulation layer 81.

The contact 6 with the first contact region 61 and the second contact 62 is arranged laterally of the emission region 3 and laterally of the protection diode region 4. In plan view onto the semiconductor device 1, the contact 6 is thus arranged without overlap with the semiconductor layer sequence 2. The surface 610 of the first contact region 61 and the surface 620 of the second contact region 62 are areas which are freely accessible for external electrical contacting and are arranged closer to the carrier 7 than a radiation exit face 10 of the emission region 3 and the top surface 40 of the protection diode region 4.

The radiation exit face 10 of the emission region 3 is free of electrical contacts of the semiconductor device 1. Shading by radiation-opaque contact material such as, for example, metal is avoided as a consequence. The top surface 40 of the protection diode region 4 may, in contrast, be completely or partially covered with metallic material, in particular by the contact layer 60. Radiation arising in the event of an electrostatic discharge may accordingly be completely or at least partially prevented from exiting from the semiconductor device 1.

The second contact region 62 is formed by means of a contact layer 60. The contact layer 60 produces an electrical contact for the second semiconductor layer 22 of the protection diode region 4 on a top surface 40, facing away from the carrier 7, of the protection diode region 4. The contact layer 60 is guided via a side face 41 of the protection diode region 4. In order to avoid an electrical short circuit, a second insulation layer 82 is arranged between the contact layer 60 and the side face 41. Electrical contact between the contact layer 60 and the protection diode region 4 proceeds in a contact opening 45 of the second insulation layer 82.

Terms such as "first insulation layer" and "second insulation layer" merely serve to simplify reference to layers or ranges of layers and, for the purposes of the present application, do not imply any sequence during production of the individual layers. Furthermore, the term "second insulation layer" does not necessarily require the presence of a first insulation layer.

In plan view onto the semiconductor device 1, the contact layer 60 and the first connection layer 51 are conveniently arranged adjacent one another without overlap. An electrical short circuit between these layers may thus straightforwardly be avoided. It is alternatively conceivable to provide a further insulation layer in the event of these layers overlapping.

FIG. 1D is a schematic representation of the alternative kinds of electrical contacting described in connection with FIGS. 1B and 1C in plan view onto the semiconductor device 1. The connecting lead 9B is placed such that it produces an electrical contact both to the first contact region 61 and to the second contact region 62 (See, e.g., FIG. 1B).

In the alternative contacting, represented by connecting lead 9A, just the first contact region 61 is contacted, such that the protection diode region 4 is not interconnected with the emission region 3 (See, e.g., FIG. 1C).

The exemplary embodiment shown in FIG. 2A of an optoelectronic semiconductor device 1 and the contacting variants shown in FIGS. 2B and 2C substantially correspond to the exemplary embodiments of a semiconductor device and an apparatus described in FIGS. 1A to 1D.

At variance therewith, the first contact region 61 and the second contact region 62 of the contact 6 are arranged on the top surface 40 of the protection diode region 4. The surface 610 of the first contact region 61 and the surface 620 of the second contact region 62 are thus at a greater distance from the carrier 7 than the top surface 40 of the protection diode region 4 and the radiation exit face 10 of the emission region 3. In plan view onto the semiconductor device 1, the first contact region 61 and the second contact region 62 overlap with the protection diode region 4. In particular, the first contact region 61 and the second contact region 62 are located completely within the protection diode region 4. The contact 6 provided for external electrical contacting of the semiconductor device to the first contact region 61 and the second contact region 62 is thus located in a region of the semiconductor device 1 which is separated from the emission region 3 and acts as a protection diode region. No additional removal of material from the semiconductor layer sequence 2 is thus required to form the contact 6.

The contact region 61 is electrically conductively connected via the contact layer 60, which is guided via the side face 41 of the protection diode region 4, to the first connection layer 51.

The two apparatuses shown in FIGS. 2B and 2C with various electrical contacting variants for the semiconductor device 1 are analogous to the variants according to FIGS. 1B and 1C respectively and permit common electrical contacting of the emission region 3 and protection diode region 4 (FIG. 2B) or sole electrical contacting of the emission region 3 without a connection to the protection diode region 4 (FIG. 2C).

With reference to FIG. 3, possible size ratios are shown by way of example for the case in which the semiconductor device 1 is a semiconductor chip with an edge length of around 1 mm. An area with the basic shape of a quarter circle with a radius of 140 μm may, for example, be used for the contact 6. Reliable placement of the connecting lead for electrically contacting the semiconductor device is thus ensured. To simplify illustration, this figure does not show the segmentation of the contact 6. The protection diode region 4 and the electrical contacting thereof are preferably constructed such that transient temperatures which arise in the event of an ESD pulse do not exceed 250° C. Thermal simulations have shown that an edge length of just 60 μm for the protection diode region in conjunction with a circular contact opening 45 to the protection diode region 4 with a radius of 12 μm meets these requirements for an 8 kV pulse. Only around 3% of the area of the semiconductor device 1 is thus required to achieve ESD protection integrated in the semiconductor device. In particular when the protection diode region 4 is arranged under the contact 6 which is in any event provided for contacting the emission region 3 of the semiconductor device 1, no further reduction in the area of the emission region 3 which would reduce radiation output is required for forming the protection diode region 4.

The invention is not restricted by the description given with reference to the exemplary embodiments. Rather, the invention encompasses any novel feature and any combination of features, including in particular any combination of features in the claims, even if this feature or this combination is not itself explicitly indicated in the claims or the exemplary embodiments.

The invention claimed is:

1. An optoelectronic semiconductor device comprising:
   an emission region comprising a semiconductor layer sequence with a first semiconductor layer, a second semiconductor layer and, arranged between the first semiconductor layer and the second semiconductor layer, an active region configured to generate radiation;
   a protection diode region; and
   a contact for external electrical contacting of the optoelectronic semiconductor device,
   wherein the contact comprises a first contact region electrically conductively connected to the emission region,
   wherein the contact comprises a second contact region located at a distance from the first contact region and electrically conductively connected to the protection diode region,
   wherein the second contact region is not directly electrically connected to the emission region, wherein the first contact region and the second contact region are externally electrically contactable by a common end of a single connecting lead, wherein the single connecting lead is a wire bond connection, wherein the semiconductor layer sequence is arranged on a carrier, wherein the first semiconductor layer is electrically conductively connected in the emission region to a first connection layer, and wherein the first connection layer extends in places between the carrier and the emission region.

2. The optoelectronic semiconductor device according to claim 1, wherein the protection diode region is a semiconductor body having a same multilayer structure as the emission region.

3. The optoelectronic semiconductor device according to claim 1, wherein the first contact region and the second contact region are arranged laterally of the emission region and laterally of the protection diode region.

4. The optoelectronic semiconductor device according to claim 1, wherein, in plan view of the optoelectronic semiconductor device, the first contact region and the second contact region overlap with the protection diode region.

5. The optoelectronic semiconductor device according to claim 1, further comprising a further contact for external electrical contacting, wherein the further contact is electrically conductively connected to the emission region and the protection diode region.

6. The optoelectronic semiconductor device according to claim 1, wherein the contact is arranged on a side of the carrier facing the semiconductor layer sequence.

7. The optoelectronic semiconductor device according to claim 5, wherein the contact is arranged on a side of the carrier facing the semiconductor layer sequence, and wherein the further contact is arranged on a side of the carrier facing away from the semiconductor layer sequence.

8. The optoelectronic semiconductor device according to claim 1, wherein the emission region comprises at least one recess extending through the first semiconductor layer and the active region into the second semiconductor layer, wherein the second semiconductor layer at the at least one recess is electrically conductively connected to a second connection layer, and wherein the second connection layer extends in places between the emission region and the carrier.

9. The optoelectronic semiconductor device according to claim 8, wherein the second connection layer is electrically conductively connected to a back surface, facing the carrier, of the protection diode region.

10. The optoelectronic semiconductor device according to claim 1, wherein a surface of the first contact region facing away from the carrier is at a same distance or substantially at the same distance from the carrier as a surface of the second contact region facing away from the carrier.

11. The optoelectronic semiconductor device according to claim 1, wherein the first contact region and the second contact region are arranged at a distance from one another of between 2 µm and 20 µm inclusive.

12. An apparatus comprising:
the optoelectronic semiconductor device according to claim 1; and
a land, wherein the first contact region is electrically contacted to the land by the single connecting lead.

13. An optoelectronic semiconductor device comprising:
an emission region comprising a semiconductor layer sequence with a first semiconductor layer, a second semiconductor layer and, arranged between the first semiconductor layer and the second semiconductor layer, an active region configured to generate radiation;
a protection diode region; and
a contact for external electrical contacting of the optoelectronic semiconductor device,
wherein the contact comprises a first contact region electrically conductively connected to the emission region,
wherein the contact comprises a second contact region located at a distance from the first contact region and electrically conductively connected to the protection diode region,
wherein the second contact region is not directly electrically connected to the emission region,
wherein the first contact region and the second contact region are externally electrically contactable by a common end of a single connecting lead, and
wherein, in plan view of the optoelectronic semiconductor device, the first contact region and the second contact region overlap with the protection diode region.

14. An optoelectronic semiconductor device comprising:
an emission region comprising a semiconductor layer sequence with a first semiconductor layer, a second semiconductor layer and, arranged between the first semiconductor layer and the second semiconductor layer, an active region configured to generate radiation;
a protection diode region; and
a contact for external electrical contacting of the optoelectronic semiconductor device,
wherein the contact comprises a first contact region electrically conductively connected to the emission region,
wherein the contact comprises a second contact region located at a distance from the first contact region and electrically conductively connected to the protection diode region,
wherein the second contact region is not directly electrically connected to the emission region,
wherein the first contact region and the second contact region are externally electrically contactable by a common end of a single connecting lead,
wherein the single connecting lead is a wire bond connection,
wherein the semiconductor layer sequence is arranged on a carrier,
wherein the contact is arranged on a side of the carrier facing the semiconductor layer sequence, and
wherein a further contact is arranged on a side of the carrier facing away from the semiconductor layer sequence.

* * * * *